(12) United States Patent
Tuan et al.

(10) Patent No.: US 7,764,081 B1
(45) Date of Patent: Jul. 27, 2010

(54) PROGRAMMABLE LOGIC DEVICE (PLD) WITH MEMORY REFRESH BASED ON SINGLE EVENT UPSET (SEU) OCCURRENCE TO MAINTAIN SOFT ERROR IMMUNITY

(75) Inventors: Tim Tuan, San Jose, CA (US); Prasanna Sundararajan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 473 days.

(21) Appl. No.: 11/197,936

(22) Filed: Aug. 5, 2005

(51) Int. Cl.
  *H03K 19/007* (2006.01)
(52) U.S. Cl. .............................. 326/14; 326/9; 326/38; 326/41; 714/754
(58) Field of Classification Search ............. 326/37–41, 326/9, 10, 12, 14, 47; 365/233, 206, 201, 365/219, 220, 221; 714/742, 733, 725, 763, 714/819
  See application file for complete search history.

(56) References Cited

U.S. PATENT DOCUMENTS

| | | | | |
|---|---|---|---|---|
| 4,151,607 | A | * | 4/1979 | Koyanagi et al. ............ 365/174 |
| 5,548,228 | A | * | 8/1996 | Madurawe .................... 326/41 |
| 5,617,551 | A | * | 4/1997 | Corder .......................... 711/1 |
| 5,847,577 | A | | 12/1998 | Trimberger |
| 6,104,211 | A | * | 8/2000 | Alfke .......................... 326/91 |
| 6,560,725 | B1 | * | 5/2003 | Longwell et al. ............. 714/54 |
| 6,700,827 | B2 | * | 3/2004 | Lien et al. ................... 365/222 |
| 6,772,387 | B1 | * | 8/2004 | Plants ......................... 714/763 |
| 6,838,331 | B2 | * | 1/2005 | Klein .......................... 438/238 |
| 6,894,527 | B1 | * | 5/2005 | Donlin et al. .................. 326/8 |
| 7,036,059 | B1 | * | 4/2006 | Carmichael et al. ......... 714/725 |
| 7,088,606 | B2 | * | 8/2006 | Turner ........................ 365/149 |
| 7,129,749 | B1 | * | 10/2006 | Fenstermaker et al. ........ 326/41 |
| 7,278,128 | B1 | * | 10/2007 | Trimberger ................... 716/17 |
| 2006/0020774 | A1 | * | 1/2006 | Ramos et al. ............... 712/226 |

OTHER PUBLICATIONS

Rabaey, J. M. et al., "Digital Integrated Circuits A Design Perspective" Second Edition, Prentice Hall Ellectronics and VLSI Senes, 2003, Chapter 12, Design Memory and Array Structures, pp. 666-670, ISBN 0-13-090996-3.

* cited by examiner

*Primary Examiner*—Rexford N Barnie
*Assistant Examiner*—Christopher Lo
(74) *Attorney, Agent, or Firm*—Thomas A. Ward; LeRoy D. Maunu; Thomas George (57) ABSTRACT

A Programmable Logic Device (PLD) is provided with configuration memory cells displaying a superior soft error immunity by combating single event upsets (SEUs) as the configuration memory cells are regularly refreshed from non-volatile storage depending on the rate SEUs may occur. Circuitry on the PLD uses a programmable timer to set a refresh rate for the configuration memory cells. Because an SEU which erases the state of a small sized memory cell due to collisions with cosmic particles may take some time to cause a functional failure, periodic refreshing will prevent the functional failure. The configuration cells can be DRAM cells which occupy significantly less space than the SRAM cells. Refresh circuitry typically provided for DRAM cells is reduced by using the programming circuitry of the PLD. Data in the configuration cells of the PLD are reloaded from either external or internal soft-error immune non-volatile memory.

18 Claims, 9 Drawing Sheets

PROGRAMMABLE LOGIC DEVICE (PLD) WITH MEMORY REFRESH BASED ON SINGLE EVENT UPSET (SEU) OCCURRENCE TO MAINTAIN SOFT ERROR IMMUNITY

BACKGROUND

1. Technical Field

The present invention relates to configuration memory cells used in a Programmable Logic Device (PLD). More particularly, the present invention relates to programming of high density configuration memory cells to increase soft error immunity when SINGLE EVENT UPSETs (SEUs) can occur.

2. Related Art

Traditional PLDs such as Complex PLDs (CPLDs) and Field Programmable Gate Arrays (FPGAs) typically use millions of Static Random Access Memory (SRAM) configuration memory cells to program the functionality of the implemented circuit. The presence of an increasing number of SRAM configuration memory cells in a PLD, with chip geometries becoming smaller and supply voltages becoming lower, increases the likelihood that the configuration memory cell storage state will become upset due to collisions with cosmic particles, or single event upsets (SEUs). With SEUs more likely to occur, the mean time to failure for a particular program configuration for the PLD will increase.

Figure 1:
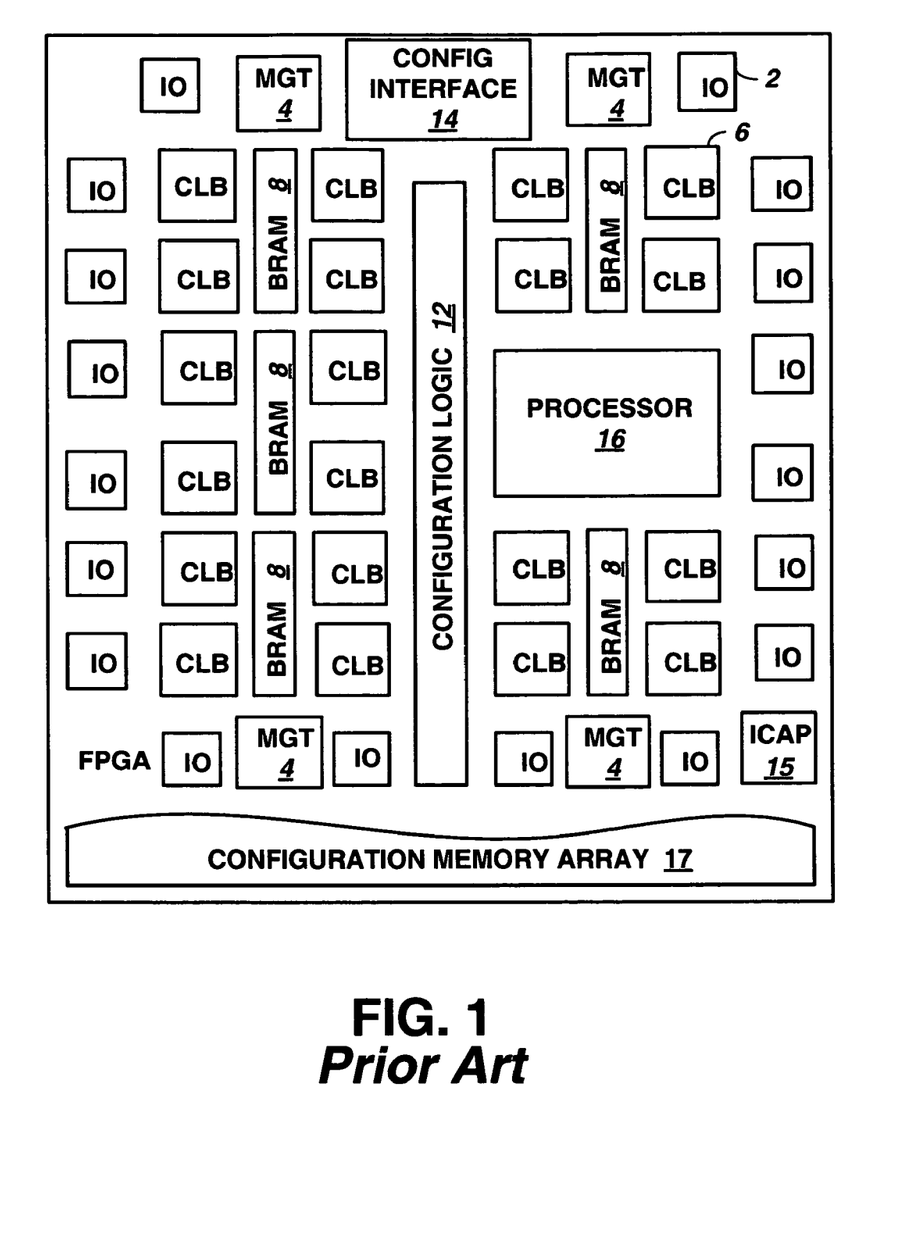
FIG. 1 shows a block diagram of typical components of an FPGA.

For reference, a block diagram of components of one PLD, a conventional FPGA, is shown in FIG. 1. The FPGA includes input/output (IOBs) blocks 2 (each labeled 10) located around the perimeter of the FPGA, multi-gigabit transceivers (MGT) 4 interspersed with the I/O blocks 2, configurable logic blocks 6 (each labeled CLB) arranged in an array, block random access memory 8 (each labeled BRAM) interspersed with the CLBs, configuration logic 12, a configuration interface 14, an on-chip processor 16, and an internal configuration access port (ICAP) 15. The FPGA also includes a programmable interconnect structure (not shown) made up of traces that are programmably connectable between the CLBs 6 and IOBs 2 and BRAMs 8.

The configuration memory array 17 typically includes millions of the SRAM memory cells shown in FIG. 1. The SRAM cells are programmed to configure the CLBs 6, IOBs 2, BRAMs 8 and appropriately connect the interconnect lines. Configuration data is provided to the SRAM cells of the configuration memory array 17 as a bitstream from an external memory (e.g., an external PROM) via configuration interface 14 and configuration logic 12. The configuration logic 12 provides for programming of the SRAM configuration memory array cells 17 at startup. The FPGA can be reconfigured by rewriting data in the configuration memory array cells 17 using the ICAP 15 or the conventional configuration interface.

Figure 2:
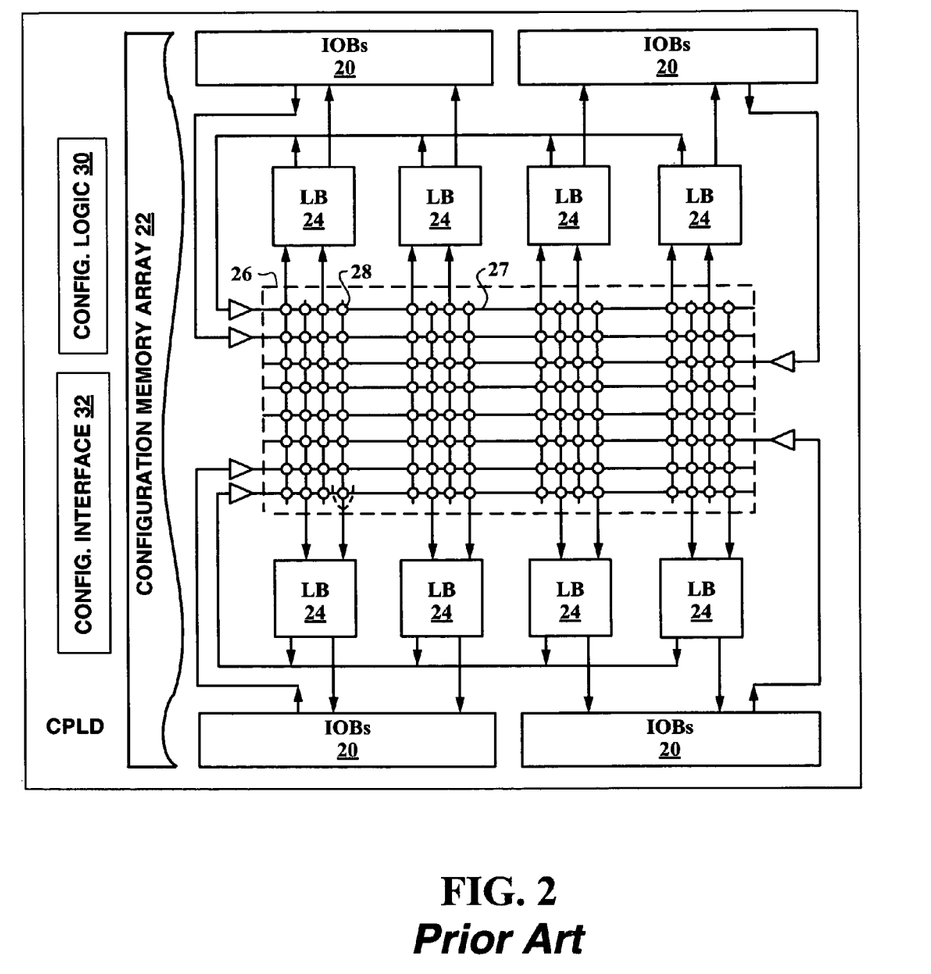
FIG. 2 shows a block diagram of typical components of a CPLD.

FIG. 2 illustrates the second type PLD, a CPLD, further illustrating the use of a configuration memory array in a PLD. CPLDs have a similar structure to FPGAs with IOBs 20 at the chip periphery, and a large SRAM configuration memory array 22 lying beneath the logic circuitry. Instead of CLBs of an FPGA, the CPLD logic includes a number of logic blocks (LBs) 24, each containing a number of wide AND gates that have outputs connected to one or more wide OR gates. A switch matrix 26 made up of interconnect lines 27 with programmable interconnect points PIPs 28 is used to programmably interconnect the IOBs 20 and LBs 24. The large SRAM configuration memory 22 made of millions of SRAM memory cells allows for programming of the PIPs 28, as well as components of the IOBs 20 and LBs 24. The configuration memory array 22 is programmed using programming or configuration logic 30 using data obtained through the configuration interface 32.

Figure 3:
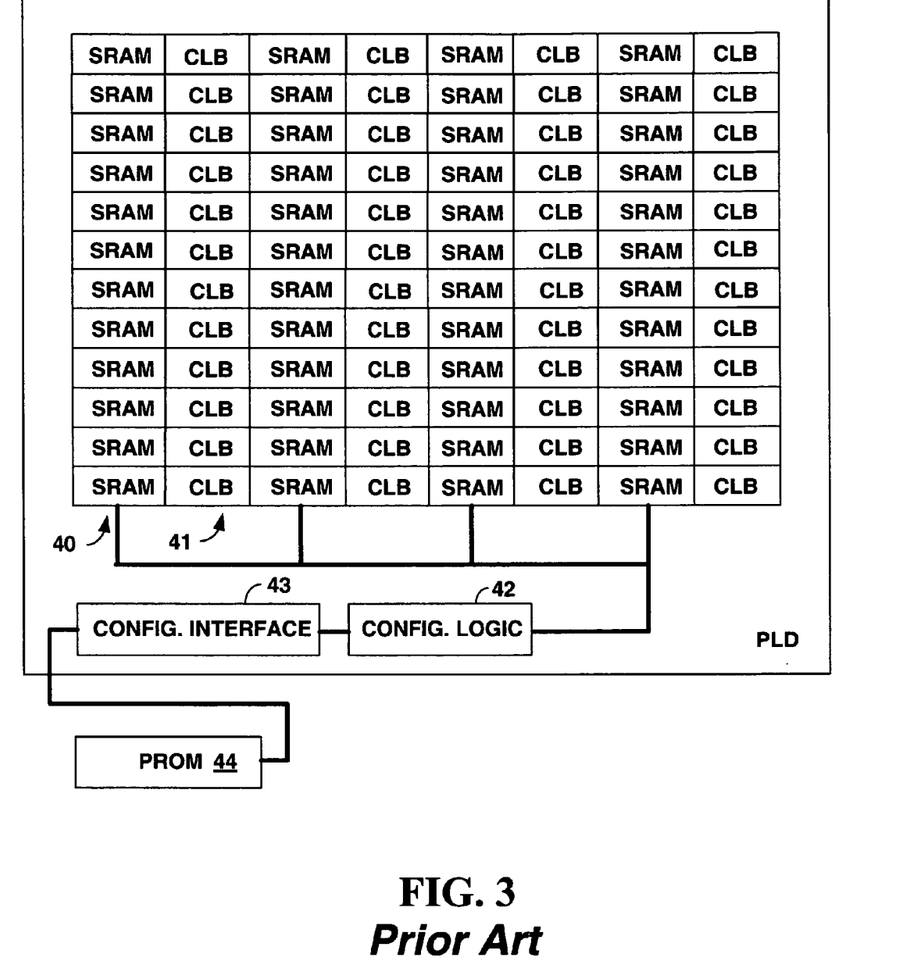
FIG. 3 shows components of a conventional SRAM based configuration memory arrangement for a PLD.

FIG. 3 shows the prior art PLD, which includes SRAM configuration memory cells 40 and logic 41. The logic 41 may be either the CLBs for an FPGA as shown in FIG. 3. The SRAM configuration memory cells 40 can also be connected to PIPs or other logic, such as in an 10B. The SRAM configuration memory cells 40 are written by the configuration logic 42, which reads the data from a PROM 44 through a configuration interface 43, the PROM typically residing off the chip. The SRAM configuration memory cells 40 are typically programmed just once upon power up, but can be reconfigured frame by frame during operation.

One solution to reducing the total chip area required for configuration memory cells is to use Dynamic Random Access Memory (DRAM) cells. This solution is described in U.S. Pat. No. 5,847,577 entitled, "DRAM Memory Cell For Programmable Logic Devices" by Stephen Trimberger, which is incorporated by reference herein in its entirety. The two most common types of memory cells are SRAM and DRAM. The main advantage of DRAM is high density, while the advantage of SRAM cells is fast access time. A DRAM memory cell includes less circuitry, resulting in a higher cell density, but will not maintain a memory state indefinitely and will include refresh circuitry to periodically reprogram the DRAM memory cells. Lower density SRAMs when compressed into higher densities to occupy the same area as a DRAM cell will experience more errors due to SEUs than the comparable DRAM cell. Whether DRAM or SRAM cells are used for the configuration memory, SEUs can still affect the state of the configuration memory, causing a decrease in the soft error immunity.

It would be desirable to provide configuration memory cells in a PLD with components programmed or configured to deal with SEUs to maintain soft error immunity. It is further desirable to provide programming adaptability so that soft error immunity can be maintained irrespective of the density of configuration cells, and whether DRAM or SRAM cells are used in the configuration memory.

SUMMARY

Embodiments of the present invention provide a PLD that displays superior soft error immunity by regularly refreshing the configuration memory in a manner programmably timed to prevent SEUs to maintain soft error immunity. Programming of the refresh time enables an adaptability to different PLD designs which may be more or less susceptible to SEUs depending on the density of configuration memory cells.

To provide for refreshing, data is loaded from soft-error immune non-volatile PROM memory and written to the configuration cells. The refresh circuitry is minimized by using the standard programming circuitry of the PLD. The refresh circuit includes a refresh timer and controller, that programmably times when refreshes are to occur and then prompts the standard programming circuitry of the PLD to perform reprogramming from the non-volatile memory. The non-volatile memory and refresh circuit time control can be accessed from a standard memory interface, or through a JTAG port typically used by the configuration memory programming circuitry.

Because an SEU may take some time to cause a functional failure in the design, the functional failure is avoided by programming the refresh timing circuit to refresh the configuration memory cell data within the defined refresh time period. The refresh time can be programmed from a user interface. Further, the refresh time can be programmed using a circuit internal to the PLD that tests to detect the occurrence of SEUs, and programs refresh timing to prevent the SEUs.

The configuration memory cells in one embodiment are DRAM cells. DRAM cells can be used to reduce the memory cell density for the PLD if desired. With DRAM memory cells used, refresh circuitry required is minimized by using the refresh circuitry provided in the PLD according to embodiments of the present invention.

BRIEF DESCRIPTION OF THE DRAWINGS

Further details of the present invention are explained with the help of the attached drawings in which.

DETAILED DESCRIPTION

Figure 4:
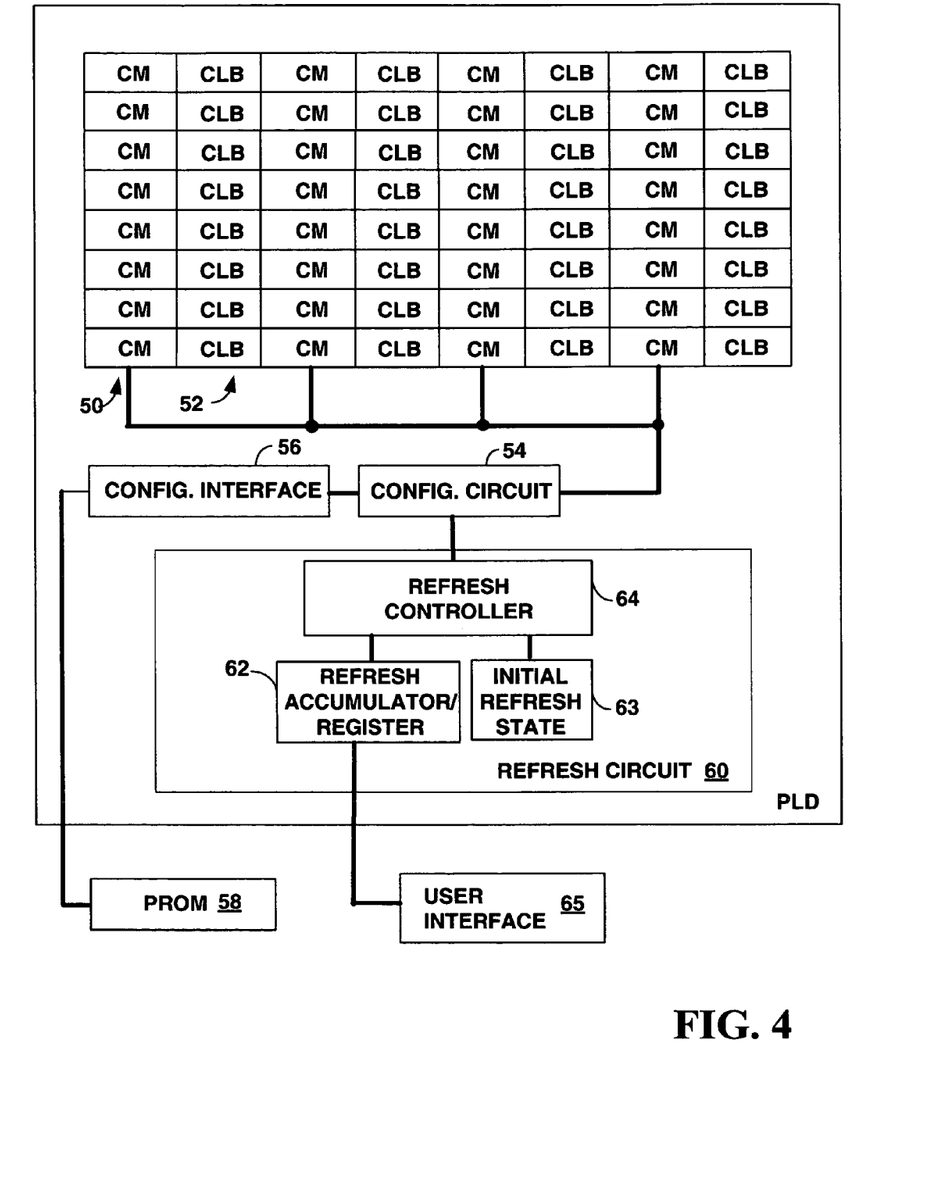
FIG. 4 shows components of a PLD according to embodiments of the present invention with DRAM configuration memory cells and refresh circuitry.

FIG. 4 shows a PLD with configuration memory cells 50 (labeled CM) and refresh logic circuitry 60 according to embodiments of the present invention. The configuration memory (CM) cells 50 are shown connected to CLBs 52 of an FPGA similar to FIG. 3, although the logic may be LBs of a CPLD as illustrated in FIG. 2, or logic in other components such as IOBs of the PLD. Similarly, although the configuration memory cells 50 are shown connected to logic, it can be connected to program a PIP used to interconnect routing resources of the PLD.

For programming the configuration memory cells 50, similar to FIG. 3, the configuration memory cells 50 of FIG. 4 are connected to configuration circuitry 54. The configuration circuit 54 reads the data for programming the configuration memory cells 50 from an external non-volatile memory, shown as PROM 58, through the configuration interface 56. The configuration interface 56 can be a standard memory interface, or a JTAG interface that is typically used during programming of the configuration memory cells 50. The configuration circuit 54 then applies appropriate voltages to program the configuration memory cells 50, and then further includes circuitry to read or verify the programming state. The configuration circuit 54 can be formed from fixed logic internal to the PLD, or provided using components such as the on-board processor 16 shown in the FPGA of FIG. 1.

Unlike the circuitry of FIG. 3, the circuit of FIG. 4 further includes a refresh circuit 60. The refresh circuit 60 periodically causes the configuration circuit 54 to read the content from the PROM, and rewrite the data to the configuration memory cells 50. Since the contents of the configuration memory cells 50 are not expected to change during operation of the PLD, the refresh will not affect the on-going chip activity. For PLDs that are reconfigured during operation, one embodiment of the present invention will disable the refresh controller during the reconfiguration process. In another embodiment, the refresh controller will only prompt reprogramming of frames of the configuration memory that are not involved in a reconfiguration process.

The refresh circuit 60 includes a refresh controller 64, a refresh accumulator/register 62, and an initial refresh state memory 63. The accumulator/register 62 forms a timer or counter that measures time intervals between refreshes of the configuration memory 50. The period between refresh cycles is programmed depending on the requirements for the memory, or based on a maximum time period before SEUs might increase an error rate above a desirable number. The accumulator/register 62 has an overflow output provided to the refresh controller 64 indicating when a refresh of the configuration memory 50 is required. The refresh controller 64 in response to the timer 62 provides signals to the configuration circuit 54 to cause rewriting or refresh of the configuration memory cells 50. The refresh circuit 60, similar to the configuration circuit 54, can be included as fixed logic in the PLD, or its function can be performed by a circuit such as the on-board processor included in the PLD.

In one embodiment, the refresh circuit 60 includes an initial refresh state memory 63. The initial state memory 63 is accessed by the refresh controller 64 to set the state of the refresh/accumulator register 62. The initial state memory 63 can be part of the configuration memory and set when the PLD is programmed by a user with a refresh time period to avoid SEUs. Alternatively, the refresh/accumulator register 62 can be connected to a user interface 65 enabling programming of the register 62 to set a refresh period as controlled by a user.

Figure 5:
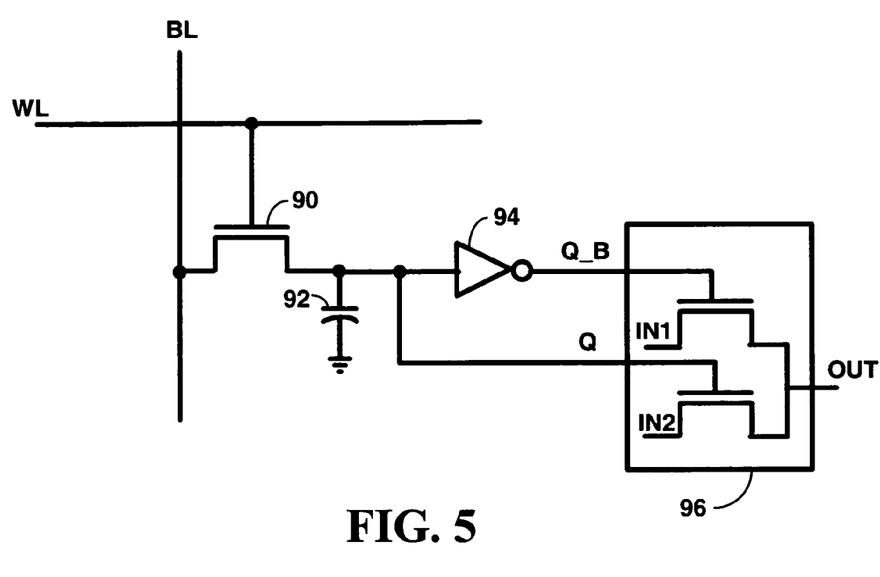
FIG. 5 shows circuitry for a DRAM configuration memory cell controlling a 2-to-1 multiplexer.

FIG. 5 shows one embodiment of circuitry for the configuration memory cells 50, namely DRAM cells. Unlike an SRAM cell that includes a latch, the DRAM cell includes a capacitor 92 as a storage device. Although an SRAM cell latch will continually hold a memory state absent an SEU, the capacitor 92 will slowly lose charge and, thus, require refreshing to maintain a memory cell state. The DRAM cell further includes a passgate transistor 90 connected to the capacitor 92. The pass-gate transistor has a gate connected to a word line (WL) and a source drain path connected on one end to a bit line (BL), and on the other end to a terminal of the capacitor 92. The DRAM cell can provide either a single output Q or complementary outputs Q and Q_B by adding an inverter 94. The DRAM cell can be written to by driving the data onto the bit line (BL) and then asserting the word line (WL) to load the data onto the capacitor. The configuration circuit 54 of FIG. 4 when DRAM cells are used is intended to include conventional circuitry to provide such bit line and word line voltages for selectively programming each cell of the configuration memory array 50.

The DRAM cell shown in FIG. 5 is connected to a 2-to-1 multiplexer 96 for providing the logic of FIG. 5. The DRAM cell controls the multiplexer by providing its true (Q) and complement (Q_B) signals to control the passgates of the multiplexer 96.

In another embodiment (not shown) two separate DRAM cells are used to provide the true (Q) and complement (Q_B)

signals. If the complement signal is not needed, the DRAM cell of FIG. 5 uses just one transistor 90 and one capacitor 92, which is a substantial area improvement compared to a typical six-transistor SRAM cell. Even if the complement signal is needed, the DRAM cell still uses just three transistors and one capacitor. In standard logic processes, the capacitor can be implemented as polysilicon-diffusion, or if a second polysilicon exists, as a polysilicon-polysilicon capacitor. In more advanced DRAM processes, the capacitor can be very densely implemented using trench-capacitor cells or stacked-capacitor cells as described in Digital Integrated Circuits, $2^{nd}$ edition, by J. Rabaey, A. Chandrakasan, and B. Nikobie, Prentice Hall. It is further contemplated that other DRAM memory cell circuit configurations known in the art can be used that have a program state that deteriorates over time, and can be refreshed to restore the programming state to minimize errors.

Figure 6:
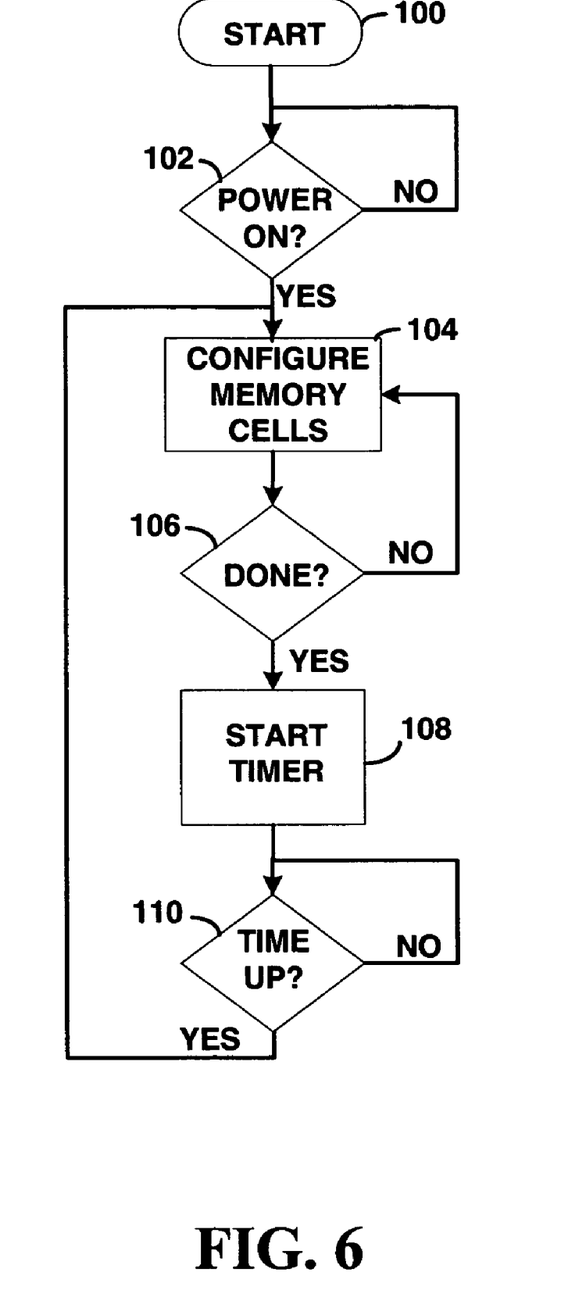
FIG. 6 is a flow diagram showing a process of programming a PLD with DRAM configuration memory cells and a refresh circuit.

FIG. 6 provides a flow diagram illustrating the behavior of the refresh circuit 60. After startup in step 100 the refresh controller 64 determines if the PLD is fully powered up in step 102. Upon full power up in step 102, the refresh controller 64 invokes an initial configuration of the PLD beginning at step 104. This initial configuration is the same as the initial configuration programming of the prior art PLD as described with respect to FIG. 3, and can be provided as part of the function of the configuration circuit 54 separate from the refresh circuit 60. Upon the completion of the initial configuration in step 102 (when DONE signal is asserted), the refresh controller starts the refresh timer 62 in step 108, the period of which determines the refresh frequency. The refresh timer 62 continues counting in step 110 until the refresh time period expires, and then the refresh controller 64 returns to step 104 to invoke the configuration circuit 54 to reconfigure the chip. This process continues while the chip is powered. This refresh timer 62 can be user programmable to control the refresh rate.

Figure 7:
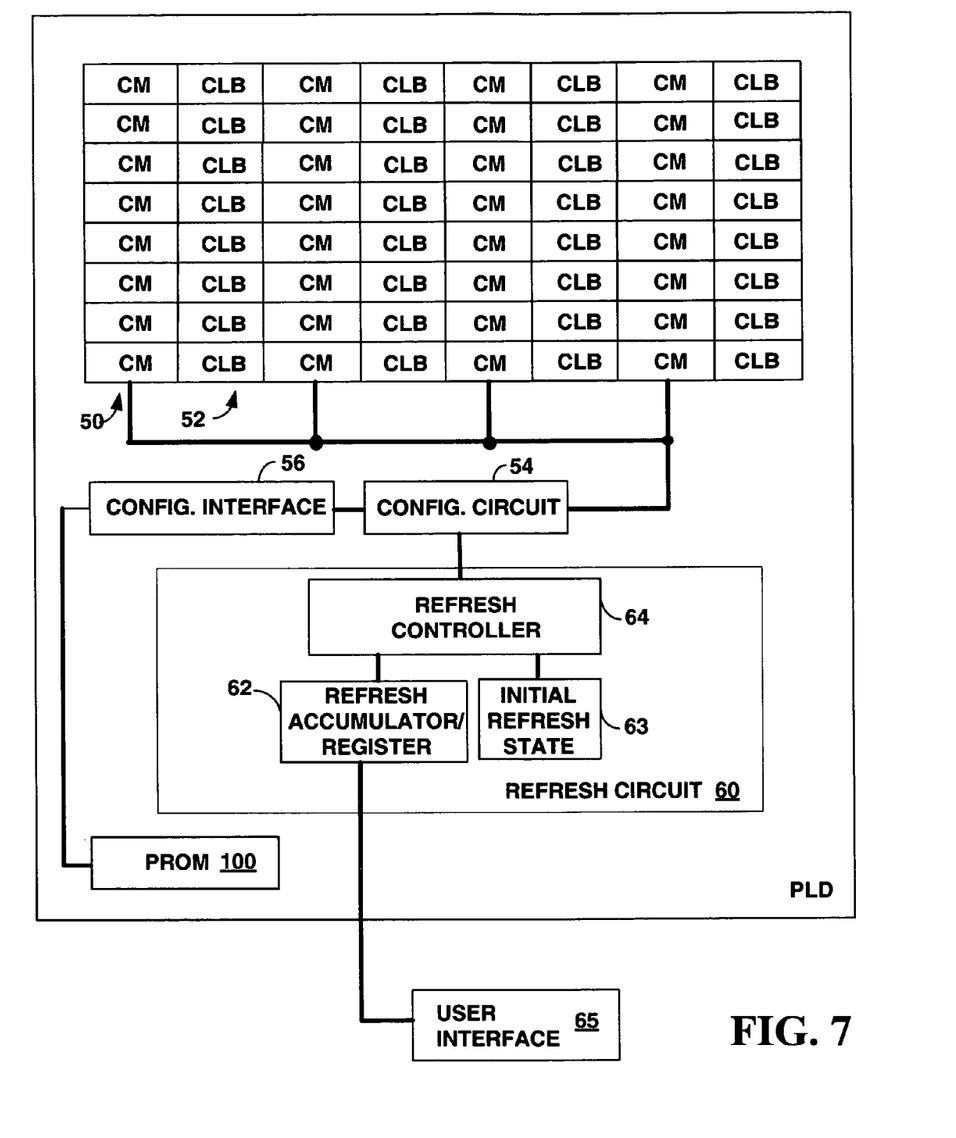
FIG. 7 shows the PLD of FIG. 4 modified to provide the non-volatile memory used for refreshing the configuration memory array on-board the PLD.

FIG. 7 shows modifications to the PLD of FIG. 4 to provide an embodiment where the PROM 100 is located internal to the PLD. As with previous embodiments, the PROM 100 can be another type of non-volatile memory. With the PROM 100 internal, the configuration circuit 54 does not need to access the PROM 100 over a configuration interface that connects to devices external to the PLD. Although the configuration interface to connect to external devices is not shown in FIG. 7, it can still be included to enable access to the configuration circuit. The behavior of the refresh circuit 60 and the DRAM configuration cells 50 are otherwise substantially the same as described in previous embodiments.

Figure 8:
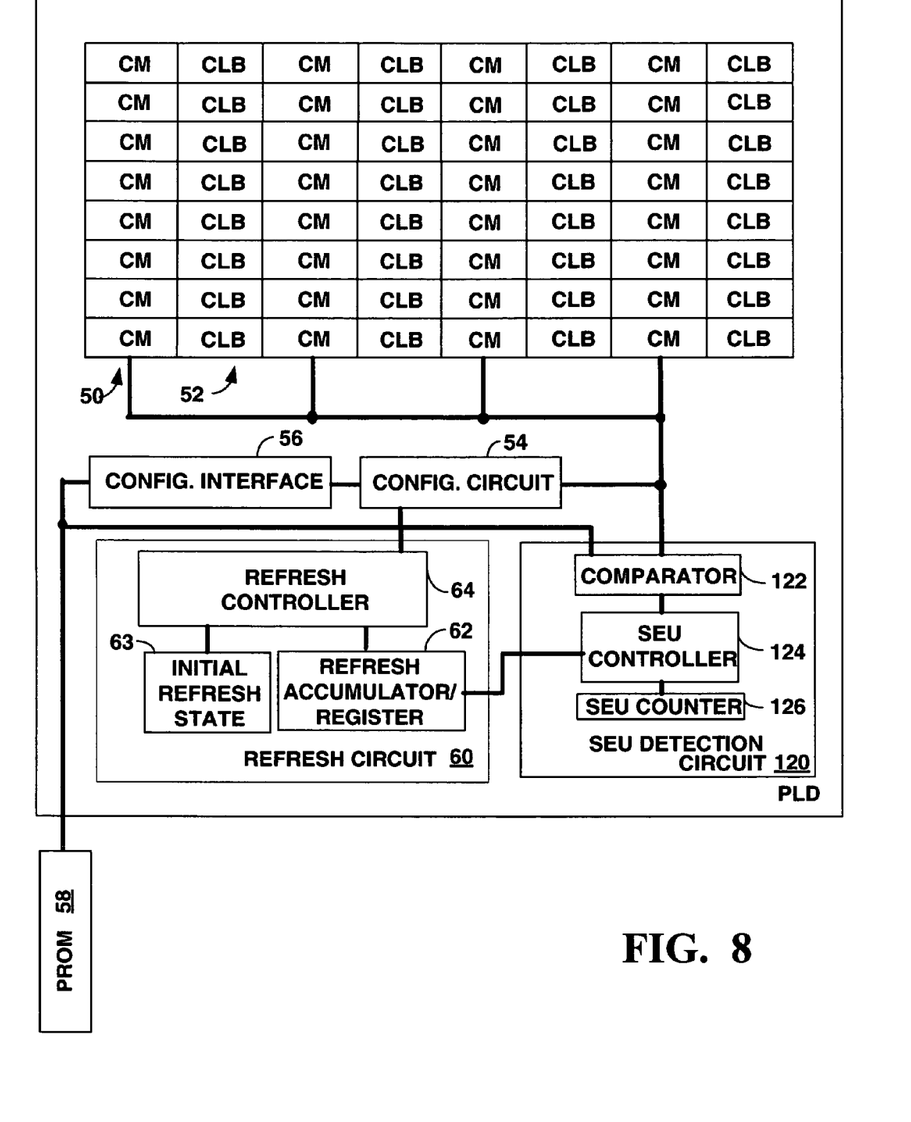
FIG. 8 shows the PLD of FIG. 4 modified to provide circuitry to determine the frequency of memory faults caused by SEU and to set the period for refresh based on the frequency.

FIG. 8 shows the PLD of FIG. 4 modified to provide SEU detection circuitry 120 to determine the frequency of memory faults in the configuration memory cells 50 caused by SEUs, or other events affecting a configuration memory cell storage state. The SEU detection circuit 140 in one embodiment includes a comparator circuit 122 to compare the contents of individual configuration memory cells 50 with the backup stored in non-volatile memory 58. In an alternative embodiment (not shown) the comparator circuit 122 compares the contents of individual configuration memory cells with other redundant configuration cells. The redundant cells can be provided in one example with a user design that provides triple mode redundancy (TMR).

With SEUs, or other events causing a configuration cell bit to inadvertently change states, the cell contents will change from the state stored in backup memory. The comparison circuit 122 is connected to a controller 124 that provides a count to register 126 of faults detected. The count register 126 is reset once the configuration memory cells 50 are completely checked, and the comparison is then repeated periodically by the controller 124. When the fault count in register 126 exceeds a desired threshold as determined by a user, the controller 124 will send a signal to the refresh timer register 62 to reset the refresh period to a shorter time period.

The SEU detection circuit 120 of FIG. 8 offers one alternative for setting the refresh period, particularly at run time. A default setting can be provided in the refresh timer 62 during initial operation from the refresh state memory 63. As another alternative for embodiments of the present invention, the refresh period is set by a user without use of the SEU detection circuit 120. A user sets the interval for the refresh timer register 62 either initially at configuration time, and/or during run time.

Although the refresh circuit 60, the SEU detection circuit 120 and the configuration circuit 54 are shown as three separate circuits, it is understood that the three circuits can be integrated into one or more logic circuits to provide embodiments of the present invention. In one embodiment, the refresh circuit 60, SEU detection circuit 120 and configuration circuit 54 can be combined with the logic of the ICAP circuit 15.

Figure 9:
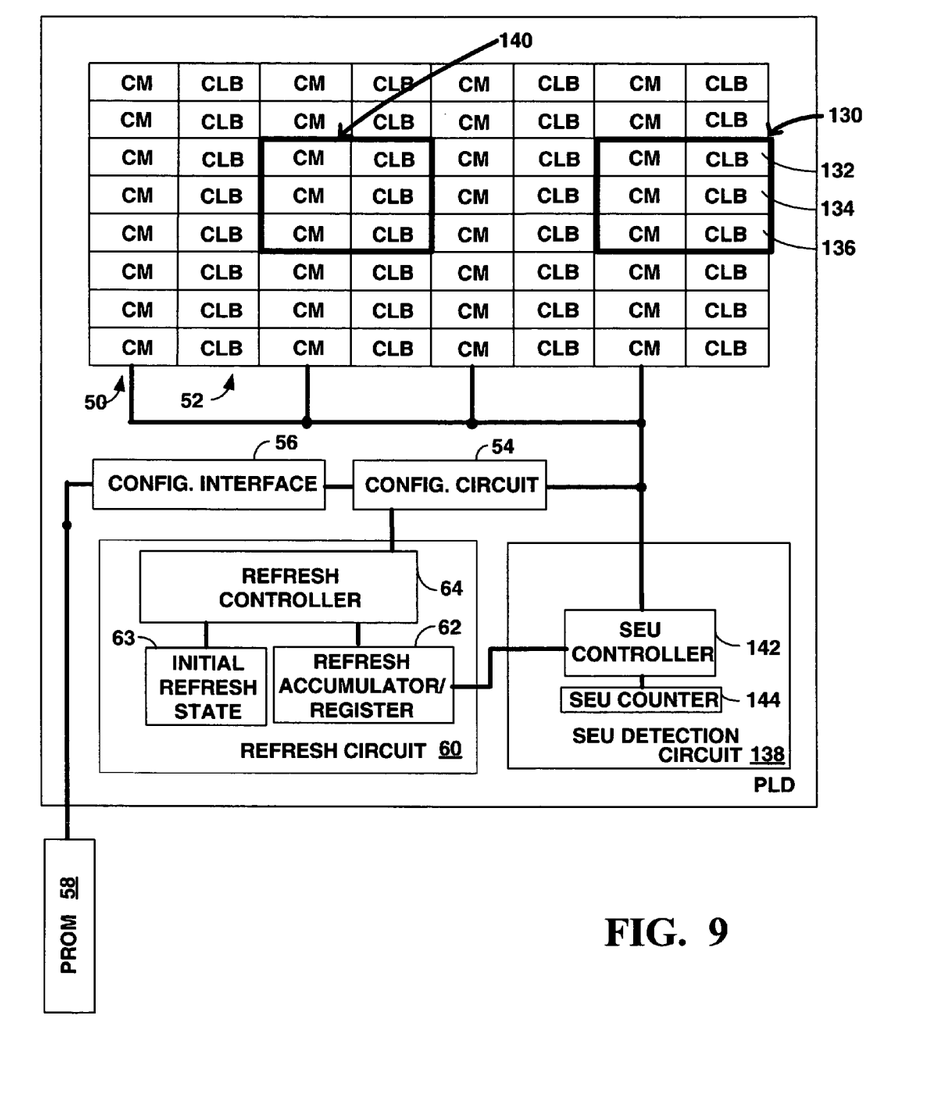
FIG. 9 shows another PLD modified to provide circuitry to determine the frequency of memory faults caused by SEU and to set the period for refresh based on the frequency.

FIG. 9 shows another PLD modified to provide circuitry to determine the frequency of memory faults caused by SEUs and to set the period for refresh. FIG. 9 shows another SEU detection circuit 138 having a SEU controller 142 connected to a SEU counter 144. For illustration purposes two triple redundant circuits 130 and 140 are shown. A triple redundant circuit has three circuits 132, 134, and 136 that are identical in function and each ideally produces the same output upon the same input. However, as circuits and the environment they work in, are not ideal, the results of the three circuits 132, 134, and 136 may be different. Typically, a majority vote is taken, and that is the result of the triple redundant circuit 130. In one embodiment if one of the outputs of the three circuits 132, 134, and 136 is different than the majority, an SEU error flag is set and sent to SEU controller 142. Similarly, if triple redundant circuit 140 has an SEU error flag, this is also sent to SEU detection circuit 138 to be counted via the programmable interconnect (not shown). The SEU controller 142 will set the refresh register 62 (and hence the refresh rate) based on the SEU error rate determined by the SEU controller 142.

Although the present invention has been described above with particularity, this was merely to teach one of ordinary skill in the art how to make and use the invention. Many additional modifications will fall within the scope of the invention, as that scope is defined by the following claims.

What is claimed is:

1. A programmable device comprising: logic blocks; configuration memory cells connected to the logic blocks for programmably configuring the logic blocks; configuration circuitry connected to the configuration memory cells to perform programming of the configuration memory cells; a memory coupled to the configuration circuitry for storing program state for the configuration memory cells; a refresh circuit connected to the configuration circuitry causing periodic programming of the configuration memory cells, wherein intervals for the periodic programming are set to maintain soft error immunity due to single event upsets (SEUs); wherein the refresh circuit comprises: a timer circuit for indicating a time period between refreshes of the configuration memory cells; and a refresh controller for providing a signal to the configuration circuitry to cause the configuration circuitry to perform programming when the timer circuit indicates a refresh should occur; wherein the periodic programming of the configuration memory cells includes reading program state from the memory and writing the program state as read from the memory to the configuration memory cells; and wherein the intervals include at least first and second intervals that are set during operation of the programmable device and the second interval is of shorter duration than the first interval.

2. The programmable device of claim 1, wherein the programmable device comprises a field programmable gate array (FPGA), and the logic blocks comprise at least a configurable logic block.

3. The programmable device of claim 1, wherein the programmable device comprises a complex programmable logic device (CPLD).

4. The programmable device of claim 1 wherein the memory is an external non-volatile memory device, the programmable device further comprising:
    a configuration interface for connecting the configuration circuitry to the external non-volatile memory device.

5. The programmable device of claim 4, wherein the configuration interface comprises a JTAG interface.

6. The programmable device of claim 1, wherein the configuration memory cells comprise dynamic random access memory (DRAM) cells.

7. The PLD programmable device of claim 6, wherein the DRAM cells comprise:
    a capacitor; and
    a pass gate transistor having a gate connected to a word line connected to the configuration circuitry, and a source-drain path connecting a bit line to a first terminal of the capacitor, wherein the bit line is further connected to the configuration circuitry.

8. The programmable device of claim 7, wherein the capacitor comprises a stacked capacitor cell.

9. The programmable device of claim 1, wherein the configuration memory cells comprise static random access memory (SRAM) cells.

10. The PLD programmable device of claim 1,
    wherein the memory is a non-volatile backup configuration memory.

11. The PLD programmable device of claim 10, further comprising:
    an SEU event detection circuit connected to the configuration memory cells and to the non-volatile backup configuration memory to compare cells states and detect if faulty bits are stored in the configuration memory cells, the SEU event detection circuit setting the intervals for the periodic programming caused by the refresh circuit depending on a number of the faulty bits detected.

12. A method for configuring logic of a programmable device comprising: programming configuration memory cells to configure the logic of the programmable device; setting and resetting time intervals between refreshes; wherein the intervals include at least first and second intervals that are set during operation of the programmable device and the second interval is of shorter duration than the first interval; prompting programming circuitry of the programmable device to reconfigure the configuration memory cells from a non-volatile memory by programming the configuration memory cells during each time interval; wherein the programming of the configuration memory cells includes reading configuration data from the non-volatile memory and writing the configuration data as read from the non-volatile memory to the configuration memory cells; and wherein one of the time intervals for when refresh is desired is reset to maintain soft error immunity due to single event upsets (SEUs).

13. The method of claim 12, further comprising:
    disabling the ability to prompt reprogramming of the configuration memory cells during a time when reconfiguration of the configuration memory cells is performed.

14. The method of claim 12, further comprising:
    prompting reprogramming of only a portion of the configuration memory cells that is not being reconfigured.

15. The method of claim 12, wherein the time interval for the refresh is reset through a user interface.

16. The method of claim 12, further comprising: reading a state of the configuration memory cells; comparing the state of the configuration memory cells with data stored in the non-volatile memory, and identifying faulty bits caused by SEUs in the configuration memory cells; and resetting the time interval for the refresh as determined by a number of the faulty bits.

17. The method of claim 12, wherein the configuration memory cells comprise static random access memory (SRAM) cells.

18. The method of claim 12, further comprising, identifying one or more error flags based on the outputs of redundant circuits of at least one triple redundant circuit; counting a count of the one or more error flags; and resetting the time interval for the refresh as determined by the count of the one or more error flags.

* * * * *